(12) United States Patent
Chang

(10) Patent No.: US 6,929,962 B1
(45) Date of Patent: Aug. 16, 2005

(54) SYSTEM AND METHOD FOR WAFER ACCEPTANCE TEST CONFIGURATION

(75) Inventor: Yung-Cheng Chang, Tainan Shien (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 12 days.

(21) Appl. No.: 10/811,190

(22) Filed: Mar. 26, 2004

(51) Int. Cl.[7] .................. G01R 31/26; H01L 21/00

(52) U.S. Cl. ............................. 438/10; 702/84

(58) Field of Search ................ 324/765, 759, 324/158.1; 702/179, 22, 27, 81–84; 714/54; 438/5, 10, 11, 17, 18; 703/14

(56) References Cited

U.S. PATENT DOCUMENTS 6,586,265 B2 * 7/2003 Chiou et al. .................. 438/14
6,615,157 B1 * 9/2003 Tsai ........................... 702/179

* cited by examiner

Primary Examiner—Evan Pert
Assistant Examiner—Tung X. Nguyen
(74) Attorney, Agent, or Firm—Thomas, Kayden, Horstemeyer & Risley

(57) ABSTRACT

A system for WAT (Wafer Acceptance Test) configuration. The system comprises an input/output device, a storage device, and a processor. The input/output device receives a first WAT model and qualification criteria. The storage device stores a preset WAT model and qualification criteria. The processor modifies the preset WAT model according to the first WAT model to generate a second WAT model, and modifies the preset qualification criteria according to the first qualification criteria to generate second qualification criteria.

21 Claims, 6 Drawing Sheets

| customer | product | FAB | Test Sites | Criteria Idast | Criteria RC | Criteria RS | Criteria Ioff |
|---|---|---|---|---|---|---|---|
| customer 1 | TM7031J | FAB6 | 9 | 2 | 4 | 4 | 4 |
| customer 2 | TM6666I | FAB12 | 13 | 2 | 6 | 6 | 2 |

FIG. 3A

| 311 | 312 | 313 | 314 | 315 | 316a | 316b | | | | 316n |
|---|---|---|---|---|---|---|---|---|---|---|
| Lot | Part ID | WFR ID | Site Number | Paramenter | value 1 | value 2 | value 3 | value 4 | value 5 | value.... |
| AXXX.1 | TM7031J | 1 | 9 | Idsat | 2.6 | 2.1 | 2.0 | 2.6 | 2.6 | ... |

FIG. 3B

| Lot | Part ID | WFR ID | Site Number | Paramenter | value 1 | value 2 | value 3 | .... | value.... |
|---|---|---|---|---|---|---|---|---|---|
| AXXX.1 | TM7031J | 1 | 9 | Failed | Pass | Pass | Pass | .... | Scrap |
| AXXX.1 | TM7031J | 2 | 9 | Pass | Pass | Pass | Pass | .... | Released |

FIG. 3C

SYSTEM AND METHOD FOR WAFER ACCEPTANCE TEST CONFIGURATION

BACKGROUND

The invention described herein relates to a Wafer Acceptance Test (WAT) and more specifically to WAT configuration.

Wafer-level electrical testing plays an important role in wafer manufacture, particularly as the cost for post-processes, such as packaging and testing, has increased rapidly. A defective wafer is identified by the testing and disposed of before it undergoes the post-processes. The WAT includes numerous testing items and is crucial for wafer manufacture.

In conventional foundry service, WAT is performed as defined by a preset WAT model, which specifies a constant number of test sites for wafers of specific size. For example, the preset WAT model specifies 5 test sites for an 8-inch wafer, and 9 test sites for a 12-inch wafer. Recently, great advances have been made in wafer manufacturing, and more specific testing has been required to determine product quality. Different WAT models and acceptance criteria are required for different products. Therefore, the standardized WAT configuration cannot satisfy various test requirements of different products. Whenever specific WAT models or acceptance criteria are required, manual intervention is required to confirm the specific test requirement, modify the standard WAT configuration and generate a customized report after the WAT is accomplished as defined by the customized WAT configuration.

Hence, there is a need for a WAT configuration system that addresses the problems arising from the existing technology.

SUMMARY

It is therefore an object of the invention to provide a system and method performing customized WAT in a foundry. To achieve this and other objects, the present invention provides a system and method for configuring WAT (Wafer Acceptance Test) according to customer requirements.

According to the present invention, a system for WAT configuration is provided. The system comprises an input/output device, a storage device, and a processor. The input/output device receives a first WAT model and qualification criteria. The storage device stores a preset WAT model and qualification criteria. The processor modifies the preset WAT model according to the first WAT model to generate a second WAT model, and modifies the preset qualification criteria according to the first qualification criteria to generate second qualification criteria.

The present invention also provides a method, implemented in the aforementioned system, for WAT configuration. First, a preset WAT model and qualification criteria, and first WAT model and qualification criteria are provided. Then, the preset WAT model is modified according to the first WAT model to generate a second WAT model, which is then transformed into a test program operable on a selected target WAT platform. In addition, the preset qualification criteria are modified according to the first qualification criteria to generate second qualification criteria, used for wafer quality control.

The above-mentioned method may take the form of program code embodied in a tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 3A to 3C show the data structure according to the present invention; and

DETAILED DESCRIPTION

The present invention will now be described with reference to FIGS. 1 to 4, which in general relate to a WAT configuration system.

Figure 1:
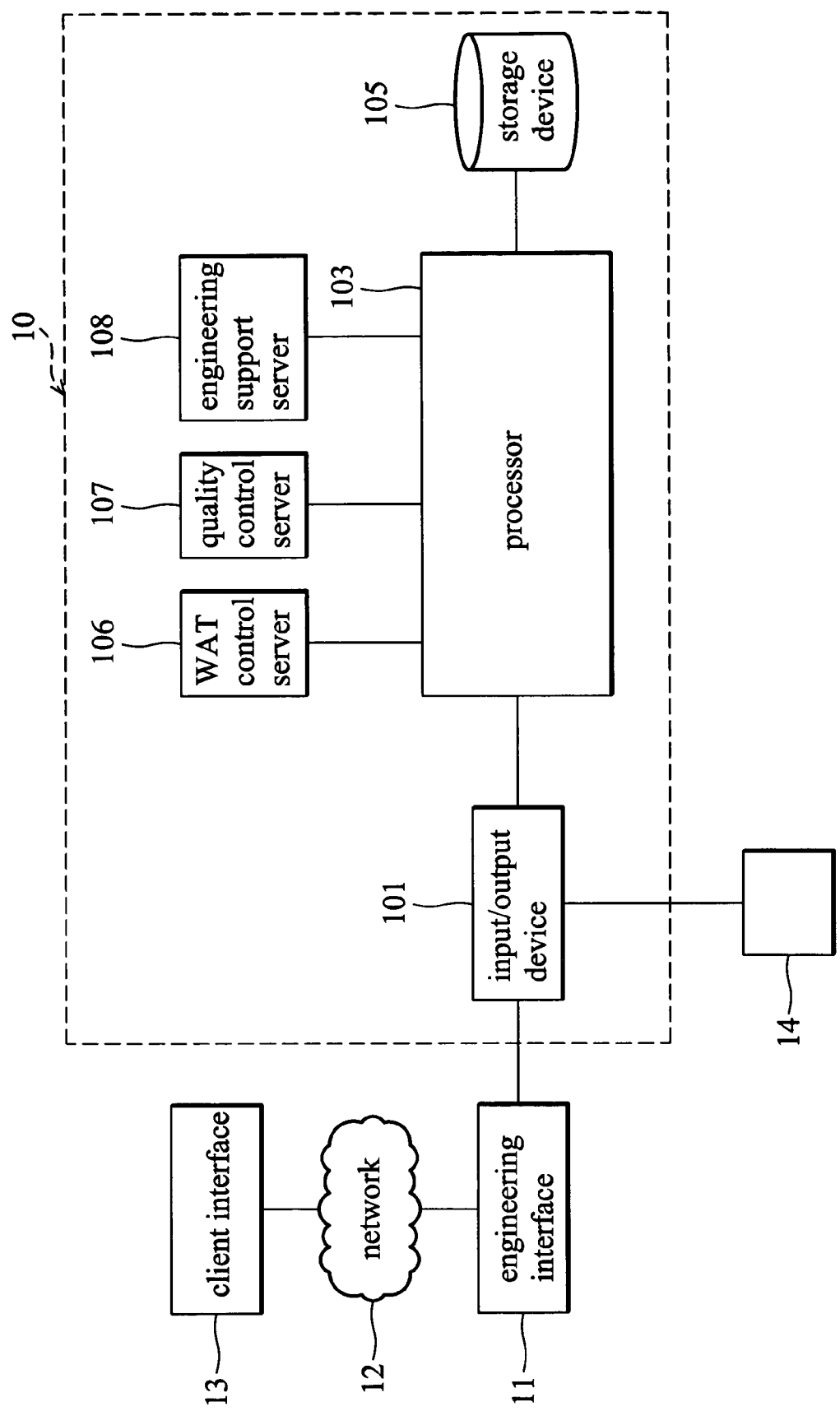
FIG. 1 is a schematic view of a WAT configuration system according to the present invention.

FIG. 1 is a schematic view of a WAT configuration system according to the present invention. The WAT configuration system 10 provides functionality for receiving a WAT requirement and generating a customized WAT configuration accordingly, including a WAT model and corresponding qualification criteria.

The WAT configuration system 10 includes an input/output device 101, a processor 103, a storage device 105, a WAT control server 106, a quality control server 107, and an engineering support server 108. The WAT configuration system 10 communicates with an engineering interface 11 and a WAT tool 14 through the input/output device 101, wherein the engineering interface communicates with a client interface 13 through a network 12. The engineering interface 11 and the client interface 13 may be personal computers capable of connecting to a network. The network 12 is a data network such as the World Wide Web through which personnel in charge of WAT may communicate with the client interface 13.

The client interface 13 is used to receive original WAT requirements. The client interface 13, in the preferred embodiment, utilizes a graphical user interface (GUI).

The engineering interface 11 receives the original WAT requirements from the client interface 13, modifies the original WAT requirements according to a preset rule, and transfers the modified WAT requirements to the WAT configuration system 10.

The WAT configuration system 10 receives the modified WAT requirements from the engineering interface 11 through the input/output device 101 and transfers it to the processor 103. The WAT requirements specify a WAT model and qualification criteria of corresponding wafers. The processor 103 retrieves a preset WAT model and qualification criteria from the storage device 105, modifies them according to the WAT requirements, and generates a customized WAT model and qualification criteria accordingly. The WAT control server 106 generates a WAT program immediately as the customized WAT model is fed in, wherein the WAT program conforms to the WAT model and is operable on a selected target WAT platform. The target WAT platform performs WAT according to the WAT model. The WAT inspects a variety of test sites as defined by the customized WAT model. The quality control server 107 receives the customized qualification criteria and examines the WAT results accordingly to determine whether the wafers conform to the corresponding requirement. The engineering support server 108 receives results of the quality examination and generates a report immediately as the qualification results are fed in.

Figure 2:
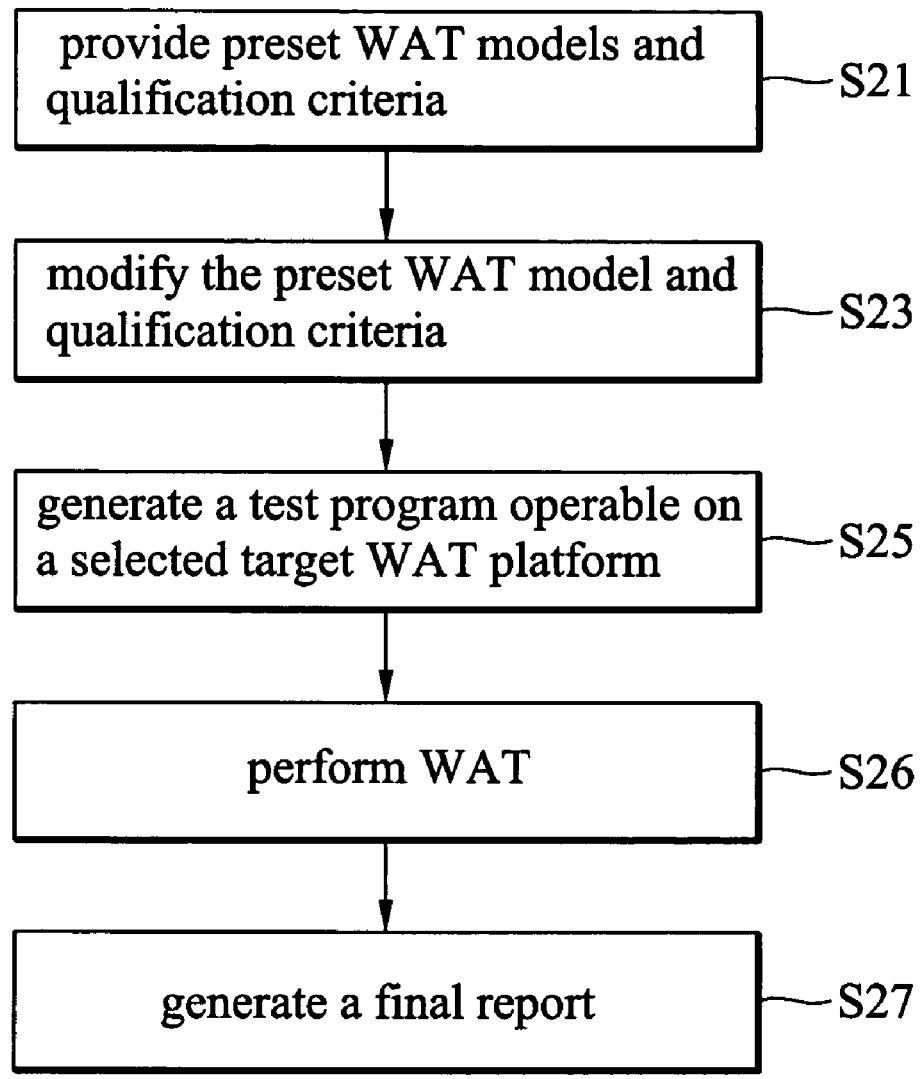
FIG. 2 is a flowchart showing a method for WAT configuration according to the present invention.

FIG. 2 is a flowchart which provides a general description of a method for WAT configuration in the aforementioned WAT configuration system. First, preset WAT models and qualification criteria are provided (step S21). The preset WAT models specify WAT settings, such as number of test sites. Generally, the number of sites are 5 and 9 for 8-inch and 12-inch, respectively. The preset qualification criteria specify an acceptance quality level of wafers. The above-mentioned preset information is stored in the storage device 105.

Second, first WAT model and qualification criteria are provided. The first WAT model and qualification criteria are derived from original WAT requirements of a client and stored in the storage device 105.

Next, the preset WAT model and qualification criteria are modified according to the first WAT model and qualification criteria to generate a second WAT model and qualification criteria (step S23). The second WAT model and qualification criteria can be stored in any format to meet particular needs. According to the preferred embodiment, the above-mentioned information is stored in the format illustrated in FIG. 3A. FIG. 3A shows a table 30, stored in storage device 105, storing information used to identify the wafer and corresponding WAT configuration, including: client name (field 301), product ID (field 302), fabricating plant ID (field 303), number of test sites (field 304), and acceptance criteria of different test items (fields 305 to 308).

After the second WAT model and qualification criteria are generated, the second WAT model is transformed into a test program operable on a selected target WAT platform (step S25). As mentioned above, the second WAT model is derived from the original WAT requirements and used to control a testing tool, thus the WAT is customized (step S26).

The WAT is performed as defined by the second WAT model, and the result thereof is used for a quality examination. The WAT result can be stored in any format to meet particular needs. According to the preferred embodiment, the WAT result is stored in the format illustrated in FIG. 3B. FIG. 3B shows a table 31, stored in storage device 105, storing identification information of the wafer and corresponding WAT results, including: wafer lot ID (field 311), product ID (field 312), wafer ID (field 313), number of test sites (field 314), key parameter of the test item (field 315), test result of each test site (fields 316a to 316n). The client can define a specific number of test sites in the original WAT requirement, which can be 5, 9, 13 sites or full map and is confirmed or revised by the engineering interface according to a preset rule. A quality report is generated according to the second qualification criteria, the WAT result, and the quality examination result. The quality report can be stored in any format to meet particular needs. According to the preferred embodiment, the above-mentioned report is stored in the formats illustrated in FIG. 3C. FIG. 3C shows a table 33, stored in storage device 105, comprising the identification information of the wafer and corresponding qualification levels, including: wafer lot ID (field 331), product ID (field 332), wafer ID (field 333), number of test sites (field 334), result of quality examination for different test items (fields 335a to 335n), and final acceptance decision (field 336). The final acceptance decision specifies the disposition of wafers according to results of quality examination thereof.

When wafers are delivered to clients, a final report is generated and sent to the clients as defined by a preset format (step S27). The final report is generated simultaneously as the results of WAT and quality examination are fed in.

The method of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 4:
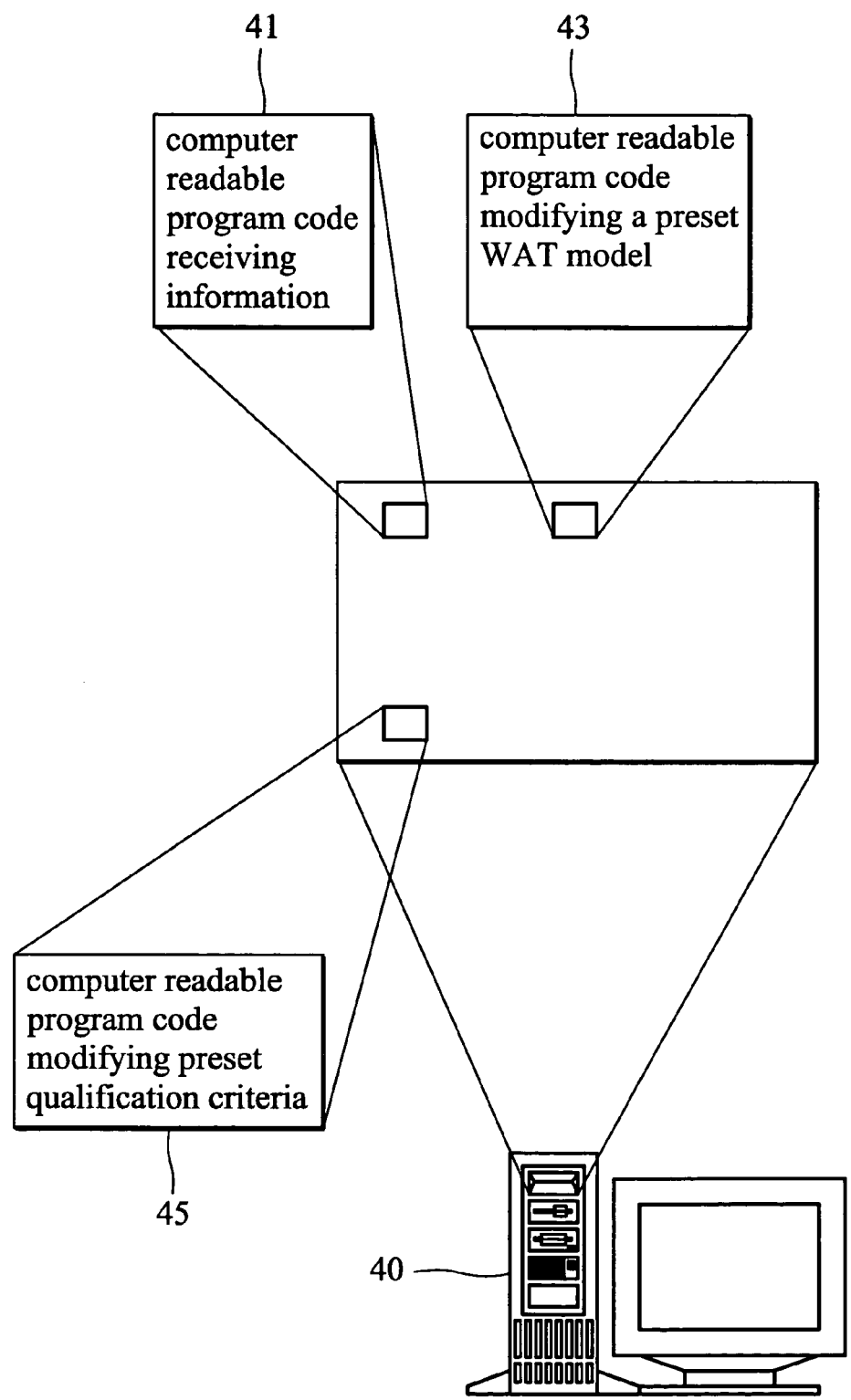
FIG. 4 is a diagram of a storage medium for storing a computer program providing the WAT configuration method.

FIG. 4 is a diagram of a storage medium for storing a computer program providing the WAT configuration method according to the present invention. The computer program product comprises a computer usable storage medium having computer readable program code embodied in the medium, the computer readable program code comprising computer readable program code 41 receiving information, computer readable program code 43 modifying a preset WAT model according to a first WAT model to generate a second WAT model, and computer readable program code 45 modifying preset qualification criteria according to first qualification criteria to generate second qualification criteria.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for WAT (Wafer Acceptance Test) configuration, comprising:
    an input/output device receiving a first WAT model and qualification criteria;
    a storage device storing a preset WAT model and qualification criteria; and
    a processor modifying the preset WAT model according to the first WAT model to generate a second WAT model, and modifying the preset qualification criteria according to the first qualification criteria to generate qualification criteria.

2. The system of claim 1, further comprising a WAT control mechanism transforming the second WAT model into a test program operable on a selected target WAT platform.

3. The system of claim 1, further comprising a quality control mechanism performing a quality examination according to the second qualification criteria.

4. The system of claim 1, further comprising an engineering support mechanism generating a report according to the second qualification criteria, WAT results, and quality examination results.

5. The system of claim 1, wherein the WAT model specifies number and arrangement of test sites in a WAT.

6. The system of claim 1, wherein the qualification criteria specifies a key parameter.

7. The system of claim 1, wherein the qualification criteria specifies an acceptable quality level.

8. A method for WAT (Wafer Acceptance Test) configuration, comprising:

providing a preset WAT model and qualification criteria;
   providing a first WAT model and qualification criteria;
   modifying the preset WAT model according to the first WAT model to generate a second WAT model;
   modifying the preset qualification criteria according to the first qualification criteria to generate second qualification criteria.

9. The method of claim 8, further comprising transforming the second WAT model into a test program operable on a selected target WAT platform.

10. A method of claim 8, further comprising performing a quality examination based on the second qualification criteria.

11. The method of claim 8, further comprising generating a quality report according to results of the WAT and the quality examination.

12. The method of claim 8, wherein the WAT model specifies number and arrangement of test sites in WAT.

13. The method of claim 8, wherein the qualification criteria specifies a key parameter.

14. The method of claim 8, wherein the qualification criteria specifies an acceptable quality level.

15. A computer readable storage medium storing a computer program providing a method for WAT (Wafer Acceptance Test) configuration, comprising:

receiving preset test and qualification criteria;
   receiving first test and qualification criteria;
   modifying the preset WAT model according to the first WAT model to generate a second WAT model;
   modifying the preset qualification criteria according to the first qualification criteria to generate second qualification criteria.

16. The storage medium of claim 15, wherein the method further comprises transforming the second WAT model into a test program operable on a selected target WAT platform.

17. The storage medium of claim 15, wherein the method further comprises performing a quality examination based on the second qualification criteria.

18. The storage medium of claim 15, wherein the method further comprises generating a quality report according to results of the WAT and the quality examination.

19. The storage medium of claim 15, wherein the WAT model specifies the number and arrangement of test sites in a WAT.

20. The storage medium of claim 15, wherein the qualification criteria specifies a key parameter.

21. The storage medium of claim 15, wherein the qualification criteria specifies an acceptable quality level.

* * * * *